(12) United States Patent
Bae et al.

(10) Patent No.: US 12,119,082 B2
(45) Date of Patent: Oct. 15, 2024

(54) SEMICONDUCTOR SYSTEM FOR PERFORMING A DUTY RATIO ADJUSTMENT OPERATION

(71) Applicant: SK hynix Inc., Icheon-si (KR)

(72) Inventors: Sang Geun Bae, Icheon-si (KR); Seung Jin Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 73 days.

(21) Appl. No.: 17/968,374

(22) Filed: Oct. 18, 2022

(65) Prior Publication Data
US 2023/0402073 A1    Dec. 14, 2023

(30) Foreign Application Priority Data
Jun. 10, 2022   (KR) .................. 10-2022-0071072

(51) Int. Cl.
*G11C 7/22*   (2006.01)
(52) U.S. Cl.
CPC .............. *G11C 7/222* (2013.01); *G11C 7/225* (2013.01); *G11C 2207/2254* (2013.01); *G11C 2207/2281* (2013.01)
(58) Field of Classification Search
CPC . G11C 7/222; G11C 7/225; G11C 2207/2254; G11C 2207/2281; G11C 7/1066
See application file for complete search history.

(56) References Cited

U.S. PATENT DOCUMENTS

| | | | |
|---|---|---|---|
| 11,061,577 B2 * | 7/2021 | Kim | G11C 29/023 |
| 2003/0031082 A1 * | 2/2003 | Sawada | G11C 7/1066 365/233.1 |
| 2008/0080262 A1 * | 4/2008 | Kang | G11C 7/1006 365/189.05 |
| 2011/0255585 A1 * | 10/2011 | Lee | H03M 9/00 375/229 |
| 2018/0336938 A1 * | 11/2018 | Koh | G11C 7/109 |
| 2021/0083655 A1 | 3/2021 | Iijima | |

FOREIGN PATENT DOCUMENTS

KR        1020050061123 A        6/2005

* cited by examiner

*Primary Examiner* — Ajay Ojha
(74) *Attorney, Agent, or Firm* — WILLIAM PARK & ASSOCIATES LTD.

(57) ABSTRACT

A semiconductor system includes a first semiconductor device configured to output a clock and pattern data, configured to receive a strobe signal and output data, and configured to adjust a duty ratio of the strobe signal by comparing odd data and even data that are generated from the output data and the pattern data, in synchronization with the strobe signal and a second semiconductor device configured to store the pattern data in synchronization with the clock, configured to output the clock as the strobe signal by adjusting a duty ratio of the clock, and configured to output the stored pattern data as the output data.

26 Claims, 14 Drawing Sheets

SEMICONDUCTOR SYSTEM FOR PERFORMING A DUTY RATIO ADJUSTMENT OPERATION

CROSS-REFERENCE TO RELATED APPLICATION

The present application claims priority under 35 U.S.C. § 119(a) to Korean application number 10-2022-0071072, filed in the Korean Intellectual Property Office on Jun. 10, 2022, the entire disclosure of which is incorporated herein by reference.

BACKGROUND

1. Technical Field

The present disclosure relates to a semiconductor system, and more particularly, to a semiconductor system for adjusting a duty ratio.

2. Related Art

Recently, as the operating speed of a semiconductor system is increased, a high-speed data transfer rate tends to be required between semiconductor devices that are included in the semiconductor system. New technologies are applied in order to satisfy a high-speed data transfer rate or a high bandwidth of data with respect to data that is serially input and output between the semiconductor devices. For example, in order to input and output data at high speed, a clock dividing scheme is used. When a clock is divided, multi-phase clocks having different phases are generated. Data is input and output at high speed by parallelizing or serializing data by using the multi-phase docks.

SUMMARY

In an embodiment, the present disclosure may provide a semiconductor device, including a data comparison circuit configured to generate an odd comparison signal by comparing odd data that is generated from input data and bits that are included in pattern data, in synchronization with an internal strobe signal, and configured to generate an even comparison signal by comparing even data that is generated from the input data and bits that are included in the pattern data, in synchronization with the internal strobe signal and a strobe signal duty adjustment circuit configured to adjust a duty ratio of the internal strobe signal for strobing the input data based on the odd comparison signal and the even comparison signal.

Furthermore, in an embodiment, the present disclosure may provide a semiconductor system including a first semiconductor device configured to output a clock and pattern data, configured to receive a strobe signal and output data, and configured to adjust a duty ratio of the strobe signal by comparing odd data and even data that are generated from the output data and the pattern data, in synchronization with the strobe signal and a second semiconductor device configured to store the pattern data in synchronization with the clock, configured to output the clock as the strobe signal by adjusting a duty ratio of the clock, and configured to output the stored pattern data as the output data.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the teachings of the present disclosure will be described in more detail through embodiments. The embodiments are only used to exemplify the teachings of the present disclosure, and the scope of the present disclosure is not limited by the embodiments.

Some embodiments of the present disclosure are directed to providing a semiconductor system in which an operation of adjusting the duty ratio of a strobe signal for strobing data is performed within each semiconductor device.

According to an embodiment, it is possible to prevent or mitigate a data error by performing an operation of adjusting the duty ratio of a strobe signal, for strobing data, within each semiconductor device.

Furthermore, according to an embodiment, it is possible to secure a valid window of data in a way to strobe data by performing an operation of adjusting the duty ratio of a strobe signal, for strobing data, within each semiconductor device.

Figure 1:
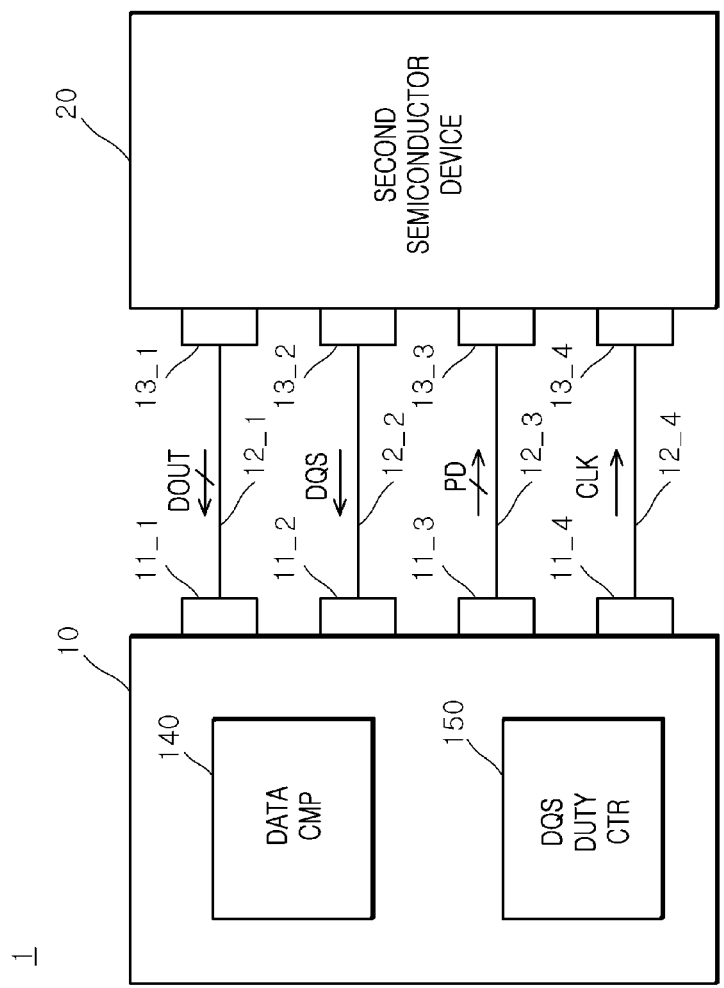
FIG. 1 is a block diagram illustrating a construction of a semiconductor system according to an embodiment of the present disclosure.

As illustrated in FIG. 1, a semiconductor system 1 according to an embodiment of the present disclosure may include a first semiconductor device 10 and a second semiconductor device 20. The first semiconductor device 10 may include a data comparison circuit (DATA CMP) 140 and a strobe signal duty adjustment circuit (DQS DUTY CTR) 150.

The first semiconductor device 10 may include a first control pin 11_1, a second control pin 11_2, a third control pin 11_3, and a fourth control pin 11_4. The second semiconductor device 20 may include a first device pin 13_1, a second device pin 13_2, a third device pin 13_3, and a fourth device pin 13_4. A first transmission line 12_1 may be connected between the first control pin 11_1 and the first device pin 13_1. A second transmission line 12_2 may be connected between the second control pin 11_2 and the second device pin 13_2. A third transmission line 12_3 may be connected between the third control pin 11_3 and the third device pin 13_3. A fourth transmission line 12_4 may be connected between the fourth control pin 11_4 and the fourth device pin 13_4. The first semiconductor device 10 may receive output data DOUT from the second semiconductor device 20 through the first transmission line 12_1. The first semiconductor device 10 may receive a strobe signal DQS from the second semiconductor device 20 through the second transmission line 12_2. The first semiconductor device 10 may output pattern data PD to the second semiconductor device 20 through the third transmission line 12_3. The first semiconductor device 10 may output a clock CLK to the second semiconductor device through the fourth transmission line 12_4. The pattern data PD may include multiple bits having a preset logic level combination after the start of a write operation and/or a read operation. The output data DOUT may be generated from the pattern data PD that is stored after the start of a read operation, after the pattern data PD is stored in the second semiconductor device 20 after the start of a write operation. The output data DOUT may include multiple bits. The clock CLK and the strobe signal DQS may be set as a signal that is toggled for a given interval in order to time the transfer of bits the pattern data PD and the output data DOUT.

The data comparison circuit 140 may compare odd data (OD_D<1:8> in FIG. 2) and even data (EV_D<1:8> in FIG. 2) that are generated from the output data DOUT in synchronization with the strobe signal DQS and the pattern data PD. The data comparison circuit 140 may generate an odd comparison signal (ODCS in FIG. 2) and an even comparison signal (EVCS in FIG. 2) by comparing the odd data (OD_D<1:8> in FIG. 2) and the pattern data PD, and the even data (EV_D<1:8> in FIG. 2) and the pattern data PD, respectively.

Figure 2:
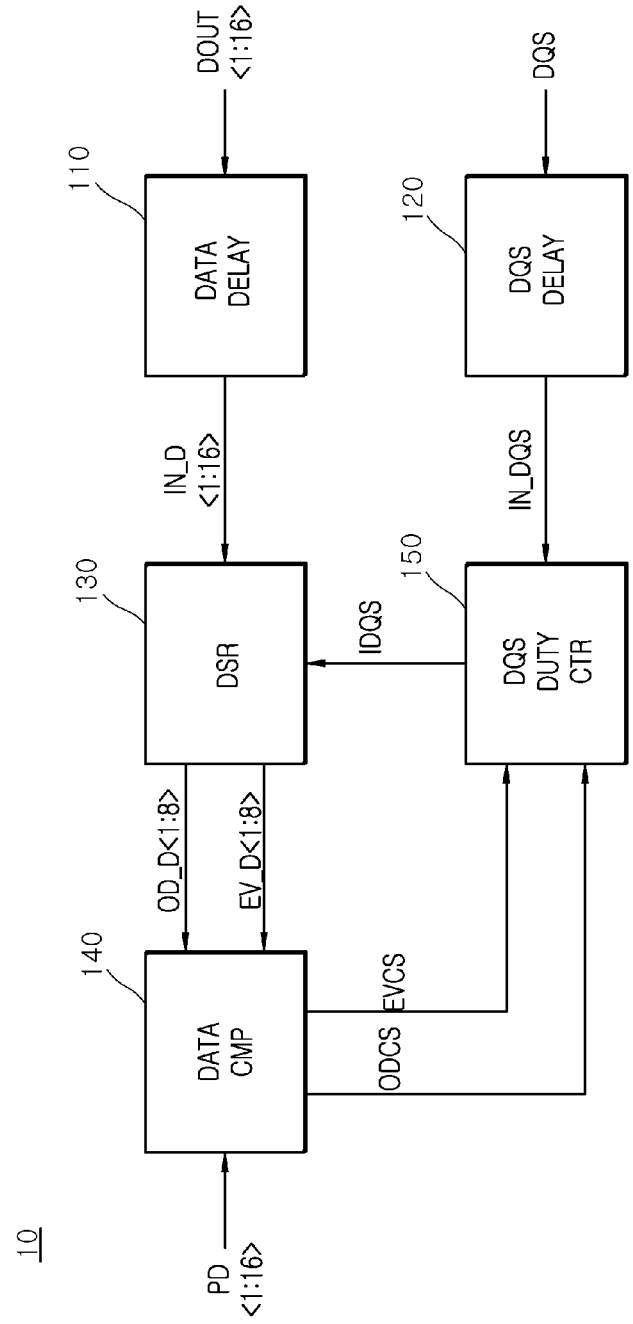
FIG. 2 is a block diagram illustrating a construction of a first semiconductor device that is included in the semiconductor system illustrated in FIG. 1.

The strobe signal duty adjustment circuit 150 may adjust the duty ratio of the strobe signal DQS based on the odd comparison signal (ODCS in FIG. 2) and the even comparison signal (EVCS in FIG. 2). The strobe signal duty adjustment circuit 150 may adjust the duty ratio of an internal strobe signal IDQS that is generated from the strobe signal DQS, based on the odd comparison signal (ODCS in FIG. 2) and the even comparison signal (SVCS in FIG. 2). The duty ratio may be set as a ratio of an interval having a logic high level and an Interval having a logic low level, which are included in the strobe signal DQS and the internal strobe signal IDQS.

The first semiconductor device 10 may receive the strobe signal DQS that is generated from the clock CLK and the output data DOUT that is generated from the pattern data PD. The first semiconductor device 10 may adjust the duty ratio of the strobe signal DQS by comparing the odd data (OD_D<1:8> in FIG. 2) and the even data (EV_D<1:8> in FIG. 2) that are generated from the output data DOUT and the pattern data PD. The first semiconductor device 10 may be implemented as a controller that controls an operation of the second semiconductor device 20.

The second semiconductor device 20 may store the pattern data PD in synchronization with the clock CLK. The second semiconductor device 20 may output the clock CLK as the strobe signal DQS by adjusting the duty ratio of the clock CLK. The second semiconductor device 20 may output the stored pattern data PD as the output data DOUT. The second semiconductor device 20 may be implemented as a nonvolatile memory device which retains data although power supply thereto is blocked.

FIG. 2 is a block diagram illustrating a construction according to an embodiment of the first semiconductor device 10. As illustrated in FIG. 2, the first semiconductor device 10 may include a data delay circuit (DATA DELAY) 110, a strobe signal delay circuit (DQS DELAY) 120, a parallel conversion circuit (DSR) 130, a data comparison circuit (DATA CMP) 140, and a strobe signal duty adjustment circuit (DQS DUTY CTR) 150.

The data delay circuit 110 may generate first to sixteenth input data IN_D<1:16> based on first to sixteenth output data DOUT<1:16> after the start of a read operation. The data delay circuit 110 may generate the first to sixteenth input data IN_D<1:16> by delaying the first to sixteenth output data DOUT<1:16> after the start of a read operation. The amount of delay of the data delay circuit 110 may be variously set in a different embodiment. The first to sixteenth output data DOUT<1:16> and the first to sixteenth input data IN_D<1:16> may be set as serial data that includes multiple bits that are sequentially input.

The strobe signal delay circuit 120 may generate an input strobe signal IN_DQS based on the strobe signal DQS after the start of a read operation. The strobe signal delay circuit 120 may generate the input strobe signal IN_DQS by delaying the strobe signal DQS after the start of a read operation. The amount of delay of the strobe signal delay circuit 120 may be variously set in a different embodiment. The strobe signal DQS and the input strobe signal IN_DQS may be set as a signal that is toggled for a given interval in order to time the transfer of bits that are included in the first to sixteenth output data DOUT<1:16> and the first to sixteenth input data IN_D<1:16>.

The amounts of delay of the data delay circuit 110 and the strobe signal delay circuit 120 may be identically set.

The parallel conversion circuit 130 may generate the first to eighth odd data OD_D<1:8> based on bits that are included in the first to sixteenth input data IN_D<1:16>, in synchronization with a rising interval of the internal strobe signal IDQS. The parallel conversion circuit 130 may generate the first to eighth even data EV_D<1:8> based on bits that are included in the first to sixteenth input data IN_D<1:16>, in synchronization with a falling interval of the internal strobe signal IDQS. The parallel conversion circuit 130 may generate the first to eighth odd data OD_D<1:8> by changing, in parallel, odd-numbered bits IN_D<1, 3, 5, 7, 9, 11, 13, 15> that are included in the first to sixteenth input data IN_D<1:16> that are input in series, in synchronization with a rising interval of the internal strobe signal IDQS. The parallel conversion circuit 130 may generate the first to eighth even data EV_D<1:8> by changing, in parallel, even-numbered bits IN_D<2, 4, 6, 8, 10, 12, 14, 16> that are included in the first to sixteenth input data IN_D<1:16> that are input in series, in synchronization with a falling interval of the internal strobe signal IDQS. The parallel conversion circuit 130 may be implemented as a common deserializer.

The data comparison circuit 140 may generate the odd comparison signal ODCS and the even comparison signal EVCS by comparing the first to eighth odd data OD_D<1:8> and first to sixteenth pattern data PD<1:16>, and the first to eighth even data EV_D<1:8> and the first to sixteenth pattern data PD<1:16>, respectively. The data comparison circuit 140 may generate the odd comparison signal ODCS by comparing the first to eighth odd data OD_D<1:8> and odd-numbered bits PD<1, 3, 5, 7, 9, 11, 13, 15> that are included in the first to sixteenth pattern data PD<1:16>, respectively. The data comparison circuit 140 may generate the odd comparison signal ODCS that is enabled when the first to eighth odd data OD_D<1:8> and the odd-numbered bits PD<1, 3, 5, 7, 9, 11, 13, 15> that are included in the first to sixteenth pattern data PD<1:16> have different logic level combinations. The data comparison circuit 140 may generate the even comparison signal EVCS by comparing the first to eighth even data EV_D<1:8> and the even-numbered bits PD<2, 4, 6, 8, 10, 12, 14, 16> that are included in the first to sixteenth pattern data PD<1:16>, respectively. The data comparison circuit 140 may generate the even comparison signal EVCS that is enabled when the first to eighth even data EV_D<1:8> and the even-numbered bits PD<2, 4, 6, 8, 10, 12, 14, 16> that are included in the first to sixteenth pattern data PD<1:16> have different logic level combinations.

The strobe signal duty adjustment circuit 150 may adjust the duty ratio of the internal strobe signal IDQS for strobing the first to sixteenth input data IN_D<1:16>, based on the odd comparison signal ODCS and the even comparison signal EVCS. The strobe signal duty adjustment circuit 150 may adjust the duty ratio of the internal strobe signal IDQS for latching the first to sixteenth input data IN_D<1:16>, based on the odd comparison signal ODCS and the even comparison signal EVCS. The strobe signal duty adjustment circuit 150 may sequentially store the odd comparison signal ODCS and the even comparison signal EVCS that are input, and may adjust the duty ratio of the internal strobe signal IDQS until the odd comparison signal ODCS and the even comparison signal EVCS that are sequentially stored in the strobe signal duty adjustment circuit 150 become identical with each other. For example, the odd comparison signal ODCS and the even comparison signal EVCS are identical with each other when they have the same logic level combinations.

Figure 3:
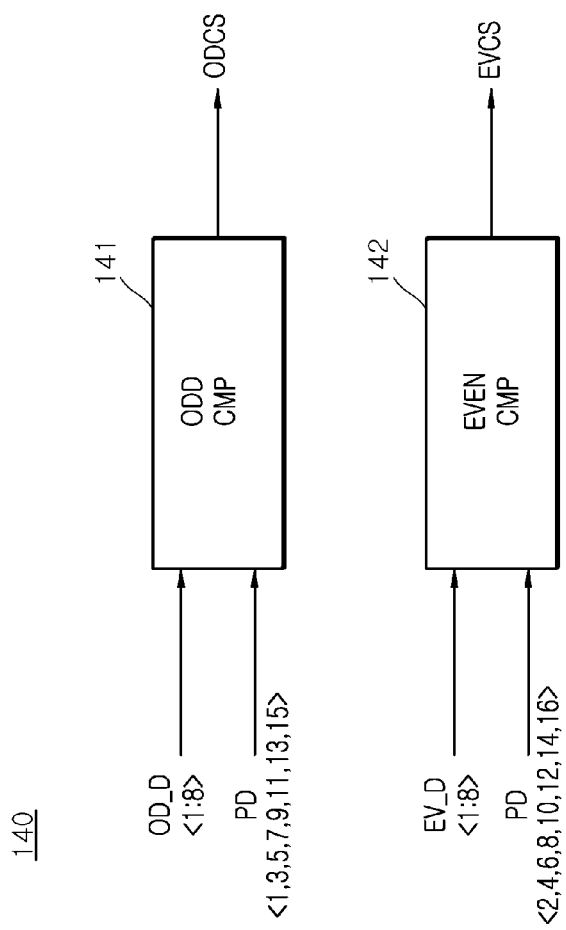
FIG. 3 is a block diagram illustrating a construction of a data comparison circuit that is included in the first semiconductor device illustrated in FIG. 2.

FIG. 3 is a block diagram illustrating a construction according to an embodiment of the data comparison circuit 140. As illustrated in FIG. 3, the data comparison circuit 140 may include an odd comparison circuit (ODD CMP) 141 and an even comparison circuit (EVEN CMP) 142.

The odd comparison circuit 141 may generate the odd comparison signal ODCS by comparing the first to eighth odd data OD_D<1:8> and the odd-numbered bits PD<1, 3, 5, 7, 9, 11, 13, 15> that are included in the first to sixteenth pattern data PD<1:16>. The odd comparison circuit 141 may generate the odd comparison signal ODCS that is enabled when the first to eighth odd data OD_D<1:8> and the odd-numbered bits PD<1, 3, 5, 7, 9, 11, 13, 15> that are included in the first to sixteenth pattern data PD<1:16> have different logic level combinations. For example, if the logic level combination of the first to eighth odd data OD_D<1:8> (i.e., 11111111) does not match the odd-numbered bits PD<1, 5, 7, 9, 11, 13, 15> (i.e., 11111110) then the odd comparison signal ODCS may be enabled. The odd comparison circuit 141 may generate the odd comparison signal ODCS that is disabled when the first to eighth odd data OD_D<1:8> and the odd-numbered bits PD<1, 3, 5, 7, 9, 11, 13, 15> that are included in the first to sixteenth pattern data PD<1:16> have the same logic level combination. For example, if the logic level combination of the first to eighth odd data OD_D<1:8> (i.e., 11111111) does match the odd-numbered bits PD<1, 3, 5, 7, 9, 11, 13, 15> (i.e., 11111111) then the odd comparison signal ODCS may be disabled. A logic level in which the odd comparison signal ODCS is enabled may be set as a logic high level or a logic low level in a different embodiment.

The even comparison circuit 142 may generate the even comparison signal EVCS by comparing the first to eighth even data EV_D<1:8> and the even-numbered bits PD<2, 4, 6, 8, 10, 12, 14, 16> that are included in the first to sixteenth pattern data PD<1:16>, The even comparison circuit 142 may generate the even comparison signal EVCS that is enabled when the first to eighth even data EV_D<1:8> and the even-numbered bits PD<2, 4, 6, 8, 10, 12, 14, 16> that are included in the first to sixteenth pattern data PD<1:16> have different logic level combinations. For example, if the logic level combination of the first to eighth even data EV_D<1:8> (i.e., 11111111) does not match the even-numbered bits PD<2, 4, 6, 8, 10, 12, 14, 16> (i.e., 011111110) then the odd comparison signal ODCS may be enabled. The even comparison circuit 142 may generate the even comparison signal EVCS that is disabled when the first to eighth even data EV_D<1:8> and the even-numbered bits PD<2, 4, 6, 8, 10, 12, 14, 16> that are included in the first to sixteenth pattern data PD<1:16> have the same logic level combination. For example, if the logic level combination of the first to eighth even data EV_D<1:8> (i.e., 11111111) does match the even-numbered bits PD<2, 4, 6, 8, 10, 12, 14, 16> (i.e., 11111111) then the odd comparison signal ODCS may be disabled. A logic level in which the even comparison signal EVCS is enabled may be set as a logic high level or a logic low level in a different embodiment.

Figure 4:
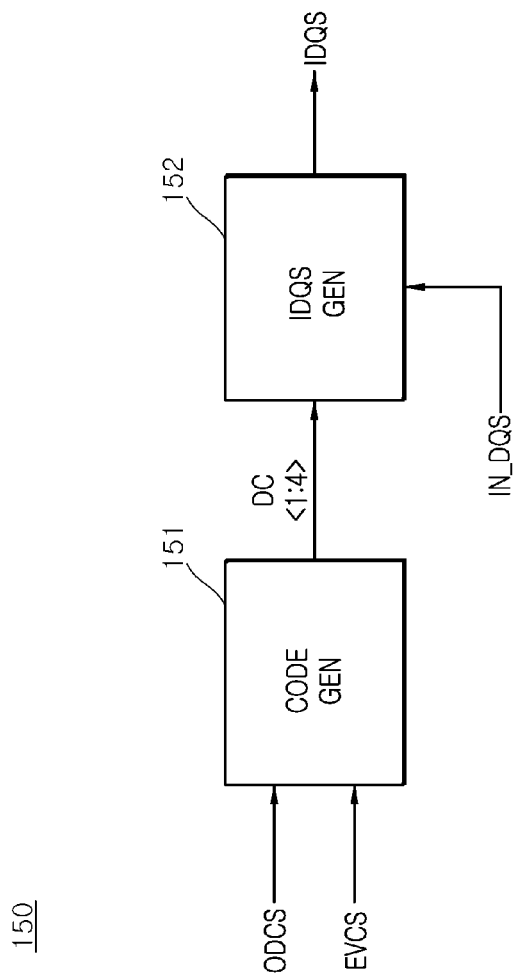
FIG. 4 is a block diagram illustrating a construction of a strobe signal duty adjustment circuit that is included in the first semiconductor device illustrated in FIG. 2.

FIG. 4 is a block diagram illustrating a construction according to an embodiment of the strobe signal duty adjustment circuit 150. As illustrated in FIG. 4, the strobe signal duty adjustment circuit 150 may include a code signal generation circuit (CODE GEN) 151 and an internal strobe signal generation circuit (IDQS GEN) 152.

The code signal generation circuit 151 may generate first to fourth duty code signals DC<1:4> for adjusting the slope of a rising interval or falling interval of the internal strobe signal IDQS, based on the odd comparison signal ODCS and the even comparison signal EVCS. The code signal generation circuit 151 may sequentially store the odd comparison signal ODCS and the even comparison signal EVCS, and may change a logic level combination of the first to fourth duty code signals DC<1:4> until the odd comparison signal ODCS and even comparison signal EVCS that are sequentially stored become the same. The code signal generation circuit 151 may sequentially store the odd comparison signal ODCS and the even comparison signal EVCS, and may generate the first to fourth duty code signals DC<1:4> a logic level combination of which has been fixed when the odd comparison signal ODCS and even comparison signal EVCS that are sequentially stored become the same.

The internal strobe signal generation circuit 152 may generate the internal strobe signal IDQS by adjusting the slope of a rising interval or falling interval of the input strobe signal IN_DQS based on the first to fourth duty code signals DC<1:4>. The internal strobe signal generation circuit 152 may generate the internal strobe signal IDQS by adjusting the slope of a rising interval or falling interval of the input strobe signal IN_DQS when a logic level combination of the first to fourth duty code signals DC<1:4> is changed. The internal strobe signal generation circuit 152 may generate the internal strobe signal IDQS as the slope of a rising interval or falling interval of the input strobe signal IN_DQS is fixed when a logic level combination of the first to fourth duty code signals DC<1:4> is fixed. When the first to fourth duty code signals DC<1:4> is fixed, it means when previously input the first to fourth duty code signals DC<1:4> is not up-counted or down-counted.

Figure 5:
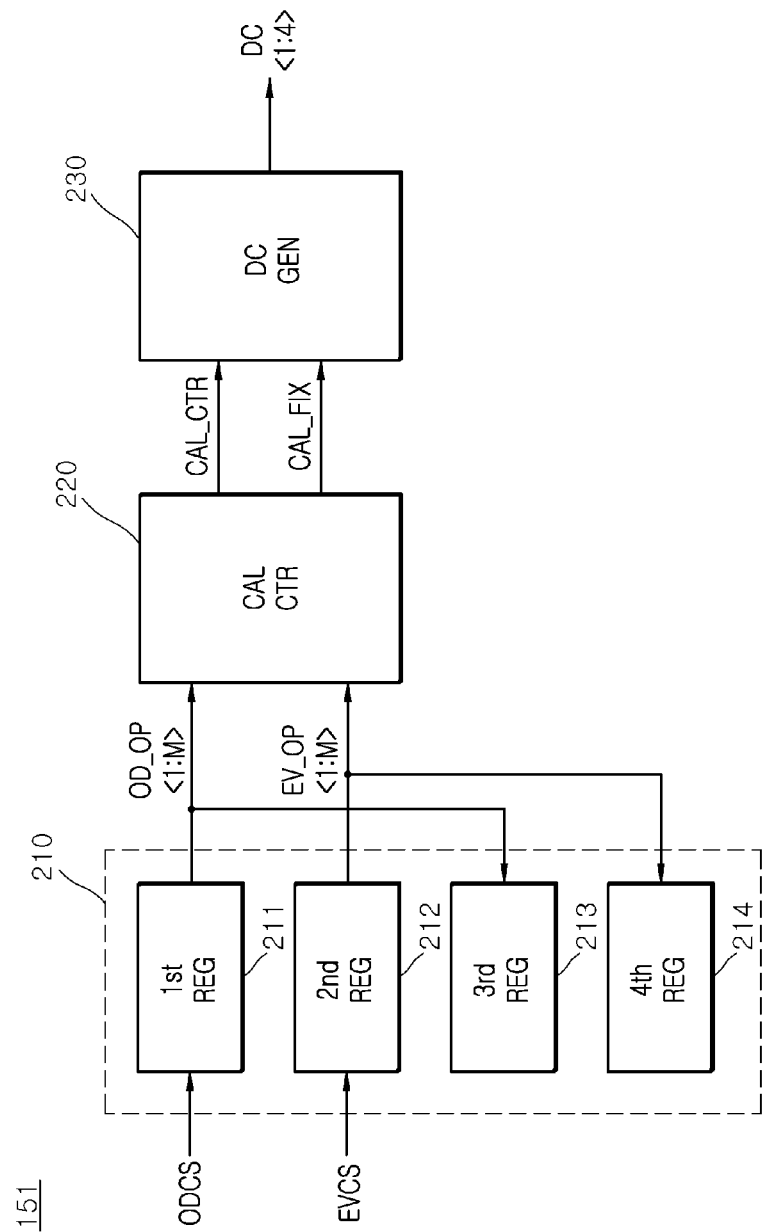
FIG. 5 is a block diagram illustrating a construction of a code signal generation circuit that is included in the strobe signal duty adjustment circuit illustrated in FIG. 4.

FIG. 5 is a block diagram illustrating a construction according to an embodiment of the code signal generation circuit 151. As illustrated in FIG. 5, the code signal generation circuit 151 may include a comparison information generation circuit 210, a calibration control circuit (CAL CTR) 220, and a duty code signal generation circuit (DC GEN) 230.

The comparison information generation circuit 210 may include a first register (1$^{st}$ REG) 211, a second register (2$^{nd}$ REG) 212, a third register (3$^{rd}$ REG) 213, and a fourth register (4$^{th}$ REG) 214. The first register 211 may consecutively receive and store the odd comparison signals ODCS. The first register 211 may generate first to M-th odd comparison information signals OD_OP<1:M> by consecutively receiving the odd comparison signals ODCS. The second register 212 may consecutively receive and store the even comparison signals EVCS. The second register 212 may generate first to M-th even comparison information signals EV_OP<1:M> by consecutively receiving the even comparison signals SVCS. The third register 213 may store the optimized first to M-th odd comparison information signals OD_OP<1:M>, and may output the optimized first to M-th odd comparison information signals OD_OP<1:M>. The fourth register 214 may store the optimized first to M-th even comparison information signals EV_OP<1:M>, and may output the optimized first to M-th even comparison information signals EV_OP<1:M>. The optimized first to M-th odd comparison information signals OD_OP<1:M> is the first to M-th odd comparison information signals OD_OP<1:M> stored when the first to fourth duty code signals DC<1:4> is fixed. The non-optimized first to M-th odd comparison information signals OD_OP<1:M> is the first to M-th odd comparison information signals OD_OP<1:M> when the first to fourth duty code signals DC<1:4> is up-counted or down-counted. The optimized first to M-th even comparison information signals EV_OP<1:M> is the first to M-th even comparison information signals EV_OP<1:M> stored when the first to fourth duty code signals DC<1:4> is fixed. The non-optimized first to M-th even comparison information signals EV_OP<1:M> is the first to M-th even comparison information signals EV_OP<1:M> when the first to fourth duty code signals DC<1:4> is up-counted or down-counted.

The comparison information generation circuit 210 may generate the first to M-th odd comparison information signals OD_OP<1:M> by consecutively receiving the odd comparison signals ODCS. The comparison information generation circuit 210 may generate the first odd comparison information signal OD_OP<1> by receiving the first odd comparison signal ODCS. The comparison information generation circuit 210 may generate the M-th odd comparison information signal OD_OP<M> by receiving an M-th odd comparison signal ODCS. The comparison information generation circuit 210 may store the first to M-th odd comparison information signals OD_OP<1:M>. The comparison information generation circuit 210 may generate the first to M-th even comparison information signals EV_OP<1:M> by consecutively receiving the even comparison signals EVCS. The comparison information generation circuit 210 may generate the first even comparison information signal EV_OP<1> by receiving the first even comparison signal EVCS. The comparison information generation circuit 210 may generate the M-th even comparison information signal EV_OP<M> by receiving the M-th even comparison signal EVCS. The comparison information generation circuit 210 may store the first to M-th even comparison information signals EV_OP<1:M>. The number M of bits of each of the first to M-th odd comparison information signals OD_OP<1:M> and the first to M-th even comparison information signals EV_OP<1:M> may be set as a natural number.

The calibration control circuit 220 may generate a calibration control signal CAL_CTR and a calibration fixing signal CAL_FIX by comparing the size of an absolute value of the first to M-th odd comparison information signals OD_OP<1:M> and the size of an absolute value of the first to M-th even comparison information signals EV_OP<1:M>. The calibration control circuit 220 may generate the calibration control signal CAL_CTR that is enabled when the size of an absolute value of the first to M-th odd comparison information signals OD_OP<1:M> is smaller than the size of an absolute value of the first to M-th even comparison information signals EV_OP<1:M>. The calibration control circuit 220 may generate the calibration control signal CAL_CTR that is disabled when the size of an absolute value of the first to M-th odd comparison information signals OD_OP<1:M> is greater than the size of an absolute value of the first to M-th even comparison information signals EV_OP<1:M>. The calibration control circuit 220 may generate the calibration fixing signal CAL_FIX that is enabled when the size of an absolute value of the first to M-th odd comparison information signals OD_OP<1:M> and the size of an absolute value of the first to M-th even comparison information signals EV_OP<1:M> are the same. The absolute value may mean a value obtained by converting a binary number into a decimal number.

The duty code signal generation circuit 230 may generate the first to fourth duty code signals DC<1:4> a logic level combination of which is changed, based on the calibration control signal CAL_CTR. The duty code signal generation circuit 230 may generate the first to fourth duty code signals DC<1:4> that are sequentially up-counted when the calibration control signal CAL_CTR is enabled. The duty code signal generation circuit 230 may generate the first to fourth duty code signals DC<1:4> that are sequentially down-counted when the calibration control signal CAL_CTR is disabled. The duty code signal generation circuit 230 may generate the first to fourth duty code signals DC<1:4> a logic level combination of which is fixed when the calibration fixing signal CAL_FIX is enabled. The calibration control circuit 220 may generate the calibration fixing signal CAL_FIX that is disabled when the size of an absolute value of the first to M-th odd comparison information signals OD_OP<1:M> and the size of an absolute value of the first to M-th even comparison information signals EV_OP<1:M> are the different.

Figure 6:
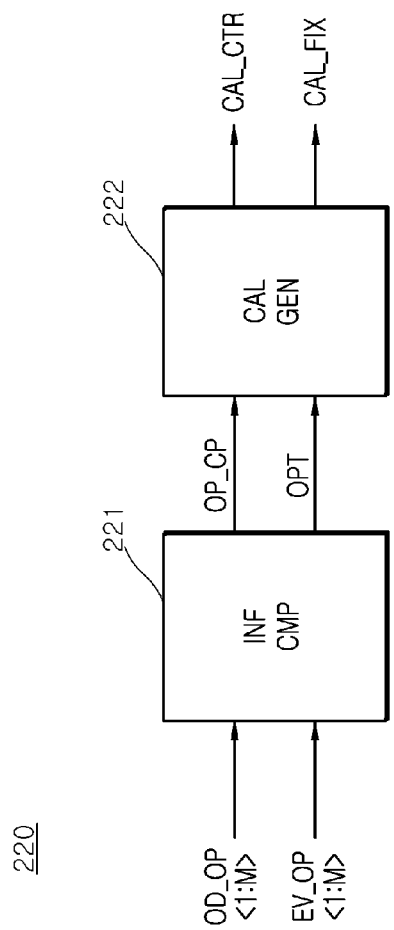
FIG. 6 is a block diagram illustrating a construction of a calibration control circuit that is included in the code signal generation circuit illustrated in FIG. 5.

FIG. 6 is a block diagram illustrating a construction according to an embodiment of the calibration control circuit 220. As illustrated in FIG. 6, the calibration control circuit 220 may include an information comparison circuit (INF CMP) 221 and a calibration control signal generation circuit (CAL GEN) 222.

The information comparison circuit 221 may generate a calibration comparison signal OP_CP and an optimization signal OPT by comparing the size of an absolute value of the first to M-th odd comparison information signals OD_OP<1:M> and the size of an absolute value of the first to M-th even comparison information signals EV_OP<1:M>. The information comparison circuit 221 may generate the calibration comparison signal OP_CP that is enabled when the size of an absolute value of the first to M-th odd comparison information signals OD_OP<1:M> is smaller than the size of an absolute value of the first to M-th even comparison information signals EV_OP<1:M>, The information comparison circuit 221 may generate the calibration comparison signal OP_CP that is disabled when the size of an absolute value of the first to M-th odd comparison information signals OD_OP<1:M> is greater than the size of an absolute value of the first to M-th even comparison information signals EV_OP<1:M>. The information comparison circuit 221 may generate the optimization signal OPT that is enabled when the size of an absolute value of the first to M-th odd comparison information signals OD_OP<1:M> and the size of an absolute value of the first to M-th even comparison information signals EV_OP<1:M> are the same. The information comparison circuit 221 may generate the optimization signal OPT that is disabled when the size of an absolute value of the first to M-th odd comparison information signals OD_OP<1:M> and the size of an absolute value of the first to M-th even comparison information signals EV_OP<1:M> are the different.

The calibration control signal generation circuit 222 may generate the calibration control signal CAL_CTR and the calibration fixing signal CAL_FIX based on the calibration comparison signal OP_CP and the optimization signal OPT. The calibration control signal generation circuit 222 may generate the calibration control signal CAL_CTR that is enabled when the calibration comparison signal OP_CP is enabled. The calibration control signal generation circuit 222 may generate the calibration control signal CAL_CTR that is disabled when the calibration comparison signal OP_CP is disabled. The calibration control signal generation circuit 222 may generate the calibration fixing signal CAL_FIX that is enabled when the optimization signal OPT is enabled. The calibration control signal generation circuit 222 may generate the calibration fixing signal CAL_FIX that is disabled when the optimization signal OPT is disabled.

Figure 7:
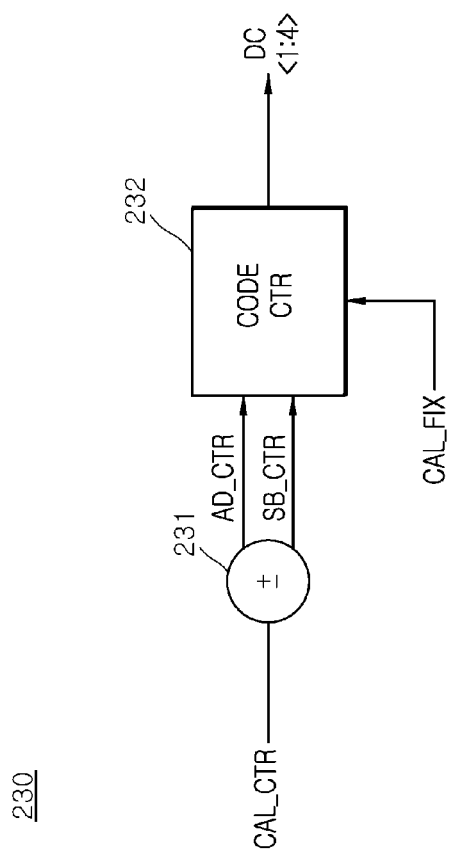
FIG. 7 is a block diagram illustrating a construction of a duty code signal generation circuit that is included in the code signal generation circuit illustrated in FIG. 5.

FIG. 7 is a block diagram illustrating a construction according to an embodiment of the duty code signal generation circuit 230. As illustrated in FIG. 7, the duty code signal generation circuit 230 may include a control signal generation circuit 231 and a code control circuit (CODE CTR) 232.

The control signal generation circuit 231 may generate an addition control signal AD_CTR and a subtraction control signal SB_CTR based on the calibration control signal CAL_CTR. The control signal generation circuit 231 may generate the addition control signal AD_CTR that is enabled when the calibration control signal CAL_CTR is enabled. The control signal generation circuit 231 may generate the subtraction control signal SB_CTR that is enabled when the calibration control signal CAL_CTR is disabled.

The code control circuit 232 may generate the first to fourth duty code signals DC<1:4> a logic level combination of which is adjusted, based on the addition control signal AD_CTR and the subtraction control signal SB_CTR. The code control circuit 232 may generate the first to fourth duty code signals DC<1:4> that are sequentially up-counted when the addition control signal AD_CTR is enabled. The code control circuit 232 may generate the first to fourth duty code signals DC<1:4> that are sequentially down-counted when the subtraction control signal SB_CTR is enabled. The code control circuit 232 may generate the first to fourth duty code signals DC<1:4> based on the calibration fixing signal CAL_FIX. The code control circuit 232 may generate the first to fourth duty code signals DC<1:4> having a fixed logic level combination when the calibration fixing signal CAL_FIX is enabled. When the first to fourth duty code signals DC<1:4> is fixed, it means when previously generated the first to fourth duty code signals DC<1:4> is not up-counted or down-counted.

Figure 8:
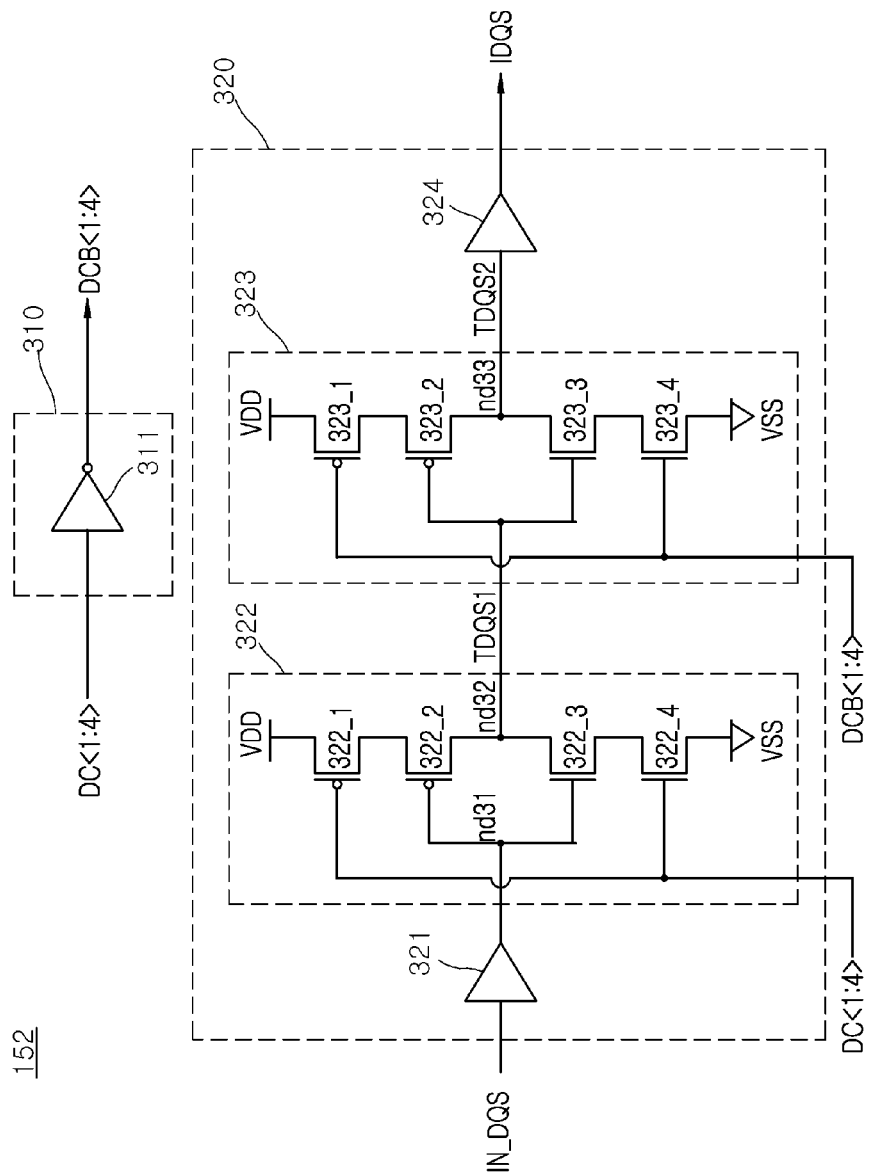
FIG. 8 is a circuit diagram illustrating a construction of an internal strobe signal generation circuit that is included in the strobe signal duty adjustment circuit illustrated in FIG. 4.

FIG. 8 is a block diagram illustrating a construction according to an embodiment of the internal strobe signal generation circuit 152. As illustrated in FIG. 8, the internal strobe signal generation circuit 152 may include an inverting circuit 310 and an internal strobe signal driving circuit 320. The internal strobe signal driving circuit 320 may include a first driver 321, a first transfer strobe signal generation circuit 322, a second transfer strobe signal generation circuit 323, and a second driver 324.

The inverting circuit 310 may be implemented as an inverter 311. The inverting circuit 310 may generate first to fourth inverted duty code signals DCB<1:4> by inverting the first to fourth duty code signals DC<1:4>. The inverting circuit 310 has been implemented as one inverter, but may be implemented as four inverters that invert the first to fourth duty code signals DC<1:4>.

The first driver 321 may drive a first node nd31 based on a logic level of the input strobe signal IN_DQS. The first driver 321 may drive the first node nd31 to a logic low level when the level of the input strobe signal IN_DQS is a logic low level. The first driver 321 may drive the first node nd31 to a logic high level when the level of the input strobe signal IN_DQS is a logic high level.

The first transfer strobe signal generation circuit 322 may be implemented as a first PMOS transistor 322_1 and a second PHOS transistor 322_2 that are connected in series between a power supply voltage VDD and a second node nd32, and a first NMOS transistor 322_3 and a second NMOS transistor 322_4 that are connected in series between the second node nd32 and a ground voltage VSS.

The first transfer strobe signal generation circuit 322 may have driving power adjusted based on a logic level combination of the first to fourth duty code signals DC<1:4>, and may generate a first transfer strobe signal TDQS1 having a logic high level by driving the second node nd32 to the level of the power supply voltage VDD by the adjusted driving power when the level of the first node nd31 is a logic low level. The first transfer strobe signal generation circuit 322 may have driving power adjusted based on a logic level combination of the first to fourth duty code signals DC<1:4>, and may generate the first transfer strobe signal TDQS1 having a logic low level by driving the second node nd32 to the level of the ground voltage VSS by the adjusted driving power when the level of the first node nd31 is a logic high level.

The first PMOS transistor 322_1 has been implemented as one PMOS transistor, but four PMOS transistors that receive the first to fourth duty code signals DC<1:4> may be connected in parallel and implemented to form the first PMOS transistor 322_1. As the number of logic low levels among bits that are included in the first to fourth duty code signals DC<1:4> is increased, driving power of the first PMOS transistor 322_1 may be increased. The second NMOS transistor 322_4 has been implemented as one NMOS transistor, but four NMOS transistors that receive the first to fourth duty code signals DC<1:4> may be connected in parallel and implemented to form the second NMOS transistor 322_4. As the number of logic high levels among bits that are included in the first to fourth duty code signals DC<1:4> is increased, driving power of the second NMOS transistor 322_4 may be increased.

The second transfer strobe signal generation circuit 323 may be implemented as a third PMOS transistor 323_1 and a fourth PMOS transistor 323_2 that are connected in series between the power supply voltage VDD and a third node nd33 and a third NOS transistor 323_3 and a fourth NMOS transistor 323_4 that are connected in series between the third node nd33 and the ground voltage VSS.

The second transfer strobe signal generation circuit 323 may have driving power adjusted based on a logic level combination of the first to fourth inverted duty code signals DCB<1:4>, and may generate a second transfer strobe signal TDQS2 having a logic high level by driving the third node nd33 to the level of the power supply voltage VDD by the adjusted driving power when the level of the second node nd32 is a logic low level. The second transfer strobe signal generation circuit 323 may have driving power adjusted based on a logic level combination of the first to fourth inverted duty code signals DCB<1:4>, and may generate the second transfer strobe signal TDQS2 having a logic low level by driving the third node nd33 to the level of the ground voltage VSS by the adjusted driving power when the level of the second node nd32 is a logic high level.

The third PMOS transistor 323_1 has been implemented as one PMOS transistor, but four PMOS transistors that receive the first to fourth inverted duty code signals DCB<1:4> may be connected in parallel and implemented to form the third PMOS transistor 323_1. As the number of logic low levels among bits that are included in the first to fourth inverted duty code signals DCB<1:4> is increased, driving power of the third PMOS transistor 323_1 may be increased. The fourth NMOS transistor 323_4 has been implemented as one NMOS transistor, but four NMOS transistors that receive the first to fourth inverted duty code signals DCB<1:4> may be connected in parallel and implemented to form the fourth NMOS transistor 323_4. As the number of logic high levels among bits that are included in the first to fourth inverted duty code signals DCB<1:4> is increased, driving power of the fourth NMOS transistor 323_4 may be increased.

The second driver 324 may drive the internal strobe signal IDQS based on a logic level of the second transfer strobe signal TDQS2. The second driver 324 may drive the internal strobe signal IDQS to a logic low level when the level of the second transfer strobe signal TDQS2 is a logic low level. The second driver 324 may drive the internal strobe signal IDQS to a logic high level when the level of the second transfer strobe signal TDQS2 is a logic high level.

Figure 9:
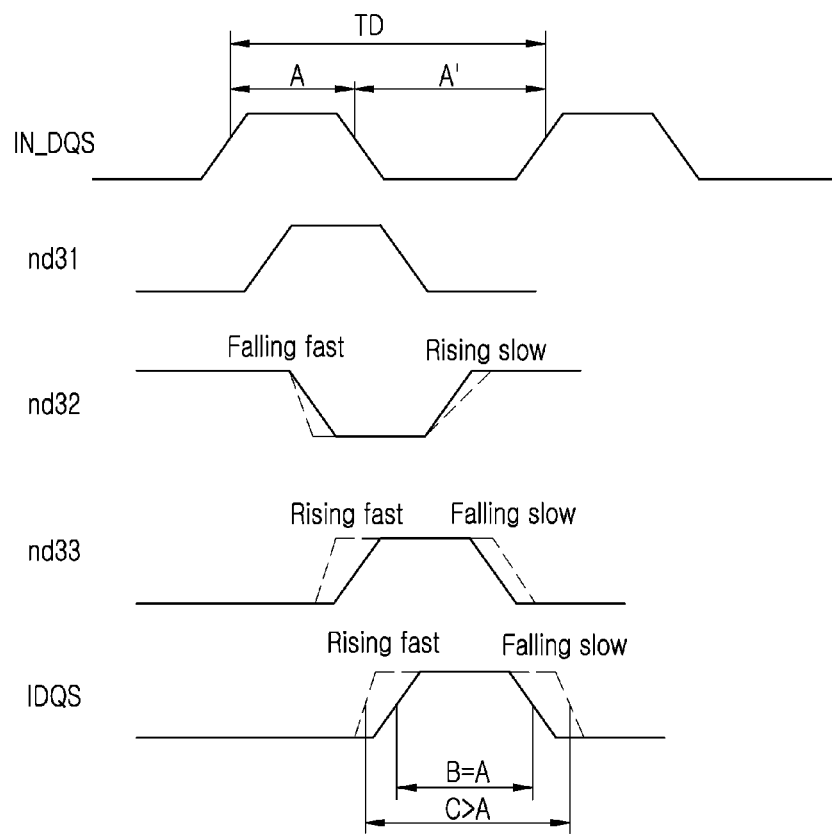
FIG. 9 is a diagram for describing an operation of an internal strobe signal generation circuit according to an embodiment of the present disclosure.

An operation of adjusting, by the internal strobe signal generation circuit 152, the duty ratio of the internal strobe signal IDQS according to an embodiment of the present disclosure is described as follows with reference to FIG. 9.

Prior to the description, the input strobe signal IN_DQS may be input in an interval A that has a logic high level and that is 45% of a set interval TD and in an interval A' that has a logic low level and that is 55% of the set interval TD. That is, the interval having the logic high level is shorter than the interval having the logic low level.

First, a case in which the first to fourth duty code signals DC<1:4> are fixed (a solid line in FIG. 9) is described as follows.

The first driver 321 may drive the first node nd31 to a logic high level when the level of the input strobe signal IN_DQS is a logic high level, and may drive the first node nd31 to a logic low level when the level of the input strobe signal IN_DQS is a logic low level.

The first transfer strobe signal generation circuit 322 may have driving power fixed based on a logic level combination of the fixed first to fourth duty code signals DC<1:4>, and may generate the first transfer strobe signal TDQS1 having a logic low level by driving the second node nd32 to the level of the ground voltage VSS by the fixed driving power when the level of the first node nd31 is a logic high level.

The first transfer strobe signal generation circuit 322 may have driving power fixed based on a logic level combination of the fixed first to fourth duty code signals DC<1:4>, and may generate the first transfer strobe signal TDQS1 having a logic high level by driving the second node nd32 to the level of the power supply voltage VDD by the fixed driving power when the level of the first node nd31 is a logic low level.

The second transfer strobe signal generation circuit 323 may have driving power fixed based on a logic level combination of the first to fourth inverted duty code signals DCB<1:4> that are inverted from the fixed first to fourth duty code signals DC<1:4>, and may generate the second transfer strobe signal TDQS2 having a logic high level by driving the third node nd33 to the level of the power supply voltage VDD by the fixed driving power when the level of the second node nd32 is a logic low level.

The second transfer strobe signal generation circuit 323 may have driving power fixed based on a logic level combination of the first to fourth inverted duty code signals DCB<1:4> that are inverted from the fixed first to fourth duty code signals DC<1:4>, and may generate the second transfer strobe signal TDQS2 having a logic low level by driving the third node nd33 to the level of the ground voltage VSS by the fixed driving power when the level of the second node nd32 is a logic high level.

The second driver 324 may drive the internal strobe signal IDQS to a logic high level when the level of the second transfer strobe signal TDQS2 is a logic high level. The second driver 324 may drive the internal strobe signal IDQS to a logic low level when the level of the second transfer strobe signal TDQS2 is a logic low level.

That is, an interval B in which the level of the internal strobe signal IDQS is a logic high level may become the same as the interval A in which the level of the input strobe signal IN_DQS is a logic high level (i.e., B=A).

A case in which the first to fourth duty code signals DC<1:4> are up-counted (a dotted line in FIG. 9) is described as follows.

The first driver 321 may drive the first node nd31 to a logic high level when the level of the input strobe signal IN_DQS is a logic high level, and may drive the first node nd31 to a logic low level when the level of the input strobe signal IN_DQS is a logic low level.

The first transfer strobe signal generation circuit 322 may have driving power increased based on a logic level combination of the first to fourth duty code signals DC<1:4> that have been up-counted, and may generate the first transfer strobe signal TDQS1 having a logic low level by driving the second node nd32 to the level of the ground voltage VSS by the increased driving power when the level of the first node nd31 is a logic high level. At this time, a falling interval of the second node nd32 falls fast (Falling fast in FIG. 9).

The first transfer strobe signal generation circuit 322 may have driving power reduced based on a logic level combination of the first to fourth duty code signals DC<1:4> that have been up-counted, and may generate the first transfer strobe signal TDQS1 having a logic high level by driving the second node nd32 to the level of the power supply voltage VDD by the reduced driving power when the level of the first node nd31 is a logic low level. At this time, a rising interval of the second node nd32 rises slow (Rising slow in FIG. 9).

The second transfer strobe signal generation circuit 323 may have driving power increased based on a logic level combination of the first to fourth inverted duty code signals DCB<1:4> that are inverted from the first to fourth duty code signals DC<1:4> that have been up-counted, and may generate the second transfer strobe signal TDQS2 having a logic high level by driving the third node nd33 to the level of the power supply voltage VDD by the increased driving power when the level of the second node nd32 is a logic low level. At this time, a rising interval of the third node nd33 rises fast (Rising fast in FIG. 9).

The second transfer strobe signal generation circuit 323 may have driving power reduced based on a logic level combination of the first to fourth inverted duty code signals DCB<1:4> that are inverted from the first to fourth duty code signals DC<1:4> that have been up-counted, and may generate the second transfer strobe signal TDQS2 having a logic low level by driving the third node nd33 to the level of the ground voltage VSS by the reduced driving power when the level of the second node nd32 is a logic high level. At this time, a falling interval of the third node nd33 falls slow (Falling slow in FIG. 9).

The second driver 324 may drive the internal strobe signal IDQS to a logic high level when the level of the second transfer strobe signal TDQS2 is a logic high level. At this time, a rising interval of the internal strobe signal IDQS rises fast (Rising fast in FIG. 9). The second driver 324 may drive the internal strobe signal IDQS to a logic low level when the level of the second transfer strobe signal TDQS2 is a logic low level. At this time, a falling interval of the internal strobe signal IDQS falls slow (Falling slow in FIG. 9).

That is, as the rising interval of the internal strobe signal IDQS rises fast and the falling interval thereof falls slow, an interval C in which the level of the internal strobe signal IDQS is a logic high level is increased more or has a longer duration than the interval A in which the level of the input strobe signal IN_DQS is a logic high level (i.e., C>A).

Figure 10:
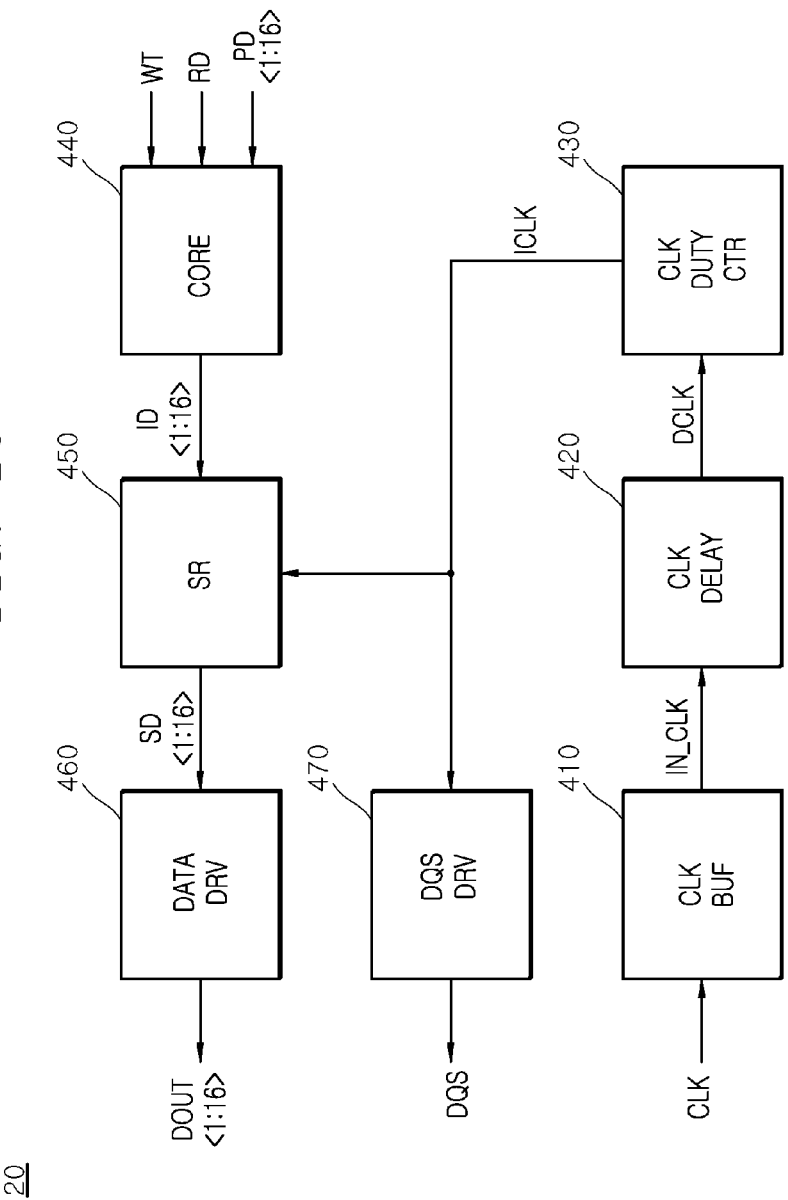
FIG. 10 is a block diagram illustrating a construction of a second semiconductor device that is included in the semiconductor system illustrated in FIG. 1.

FIG. 10 is a block diagram illustrating a construction according to an embodiment of the second semiconductor device 20. As illustrated in FIG. 10, the second semiconductor device 20 may include a clock buffer (CLK BUF) 410, a clock delay circuit (CLK DELAY) 420, a clock duty adjustment circuit (CLK DUTY CTR) 430, a core circuit (CORE) 440, a serial conversion circuit (SR) 450, a data driver (DATA DRV) 460, and a strobe signal driver (DQS DRV) 470.

The clock buffer 410 may generate an input clock IN_CLK by receiving a clock CLK. The clock buffer 410 may generate the input clock IN_CLK by buffering the clock CLK.

The clock delay circuit 420 may generate a delay clock DCLK based on the input clock IN_CLK. The clock delay circuit 420 may generate the delay clock DCLK by delaying the input clock IN_CLK. The amount of delay of the clock delay circuit 420 may be variously set in a different embodiment.

The clock duty adjustment circuit 430 may generate an internal clock ICLK by adjusting the duty ratio of the delay clock DCLK. The clock duty adjustment circuit 430 may generate the internal clock ICLK by adjusting the duty ratio of the delay clock DCLK the duty ratio of which has been changed through the clock buffer 410 and the clock delay circuit 420. The clock duty adjustment circuit 430 may be implemented as a common duty cycle corrector (DCC) for identically adjusting a logic high level interval and logic low level interval of the delay clock DCLK.

The core circuit 440 may store first to sixteenth pattern data PD<1:16> after the start of a write operation. The core circuit 440 may store the first to sixteenth pattern data PD<1:16> when a write signal WT for performing a write operation is enabled. The core circuit 440 may output the stored first to sixteenth pattern data PD<1:16> as first to sixteenth internal data ID<1:16> after the start of a read operation. The core circuit 440 may output the stored first to sixteenth pattern data PD<1:16> as the first to sixteenth internal data ID<1:16> when a read signal RD for performing a read operation is enabled. The core circuit 440 may be implemented as a common memory circuit including multiple memory cells.

The serial conversion circuit 450 may generate first to sixteenth serial data SD<1:16> based on the first to sixteenth internal data ID<1:16> in synchronization with the internal dock ICLK. The serial conversion circuit 450 may generate the first to sixteenth serial data SD<1:16> by serially converting the first to sixteenth internal data ID<1:16> that are input in parallel, in synchronization with a rising interval and falling interval of the internal clock ICLK. The serial conversion circuit 450 may be implemented as a common serializer.

The data driver 460 may generate first to sixteenth output data DOUT<1:16> based on the first to sixteenth serial data SD<1:16>. The data driver 460 may output the first to sixteenth output data DOUT<1:16> by driving the first to sixteenth output data DOUT<1:16> based on a logic level of the first to sixteenth serial data SD<1:16>.

The strobe signal driver 470 may generate a strobe signal DQS based on the internal clock ICLK. The strobe signal driver 470 may output the strobe signal DQS by driving the strobe signal DQS based on a logic level of the internal clock ICLK.

Figure 11:
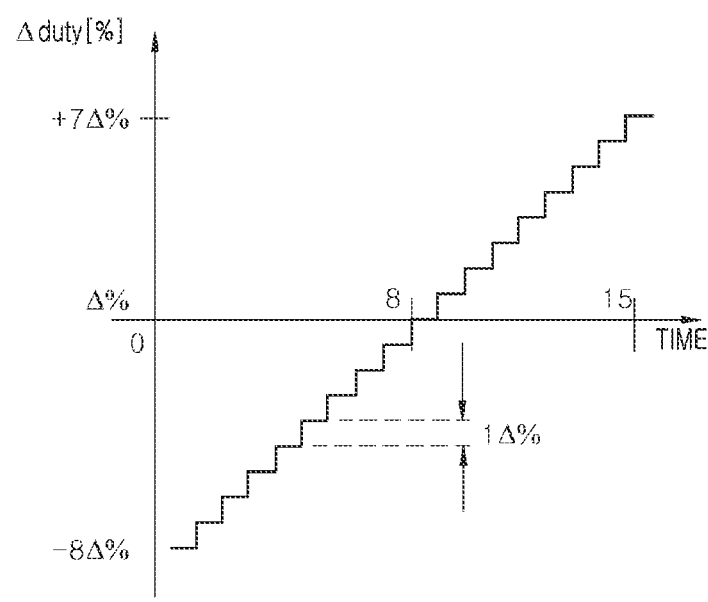
FIGS. 11 and 12 are diagrams for describing a duty ratio adjustment operation according to an embodiment of the present disclosure.

A duty ratio adjustment operation which is adjusted based on a logic level combination of the first to fourth duty code signals DC<1:4> according to an embodiment of the present disclosure is described as follows with reference to FIG. 11.

The first to fourth duty code signals DC<1:4> may be implemented as four bits, and may adjust a duty ratio having a total of sixteen steps. For example, if all of the first to fourth duty code signals DC<1:4> are down-counted and all the bits thereof have a logic low level, the duty ratio may be adjusted as −8Δ. If all of the first to fourth duty code signals DC<1:4> are up-counted and all the bits thereof have a logic high level, the duty ratio may be adjusted as +7Δ.

When the first to fourth duty code signals DC<1:4> are once up-counted, the duty ratio may be increased by +1Δ. When the first to fourth duty code signals DC<1:4> are once down-counted, the duty ratio may be decreased by −1Δ.

In the duty ratio adjustment operation, the duty ratio may be variously adjusted in proportion to the number of bits of a duty code signal in different embodiments.

Figure 12:
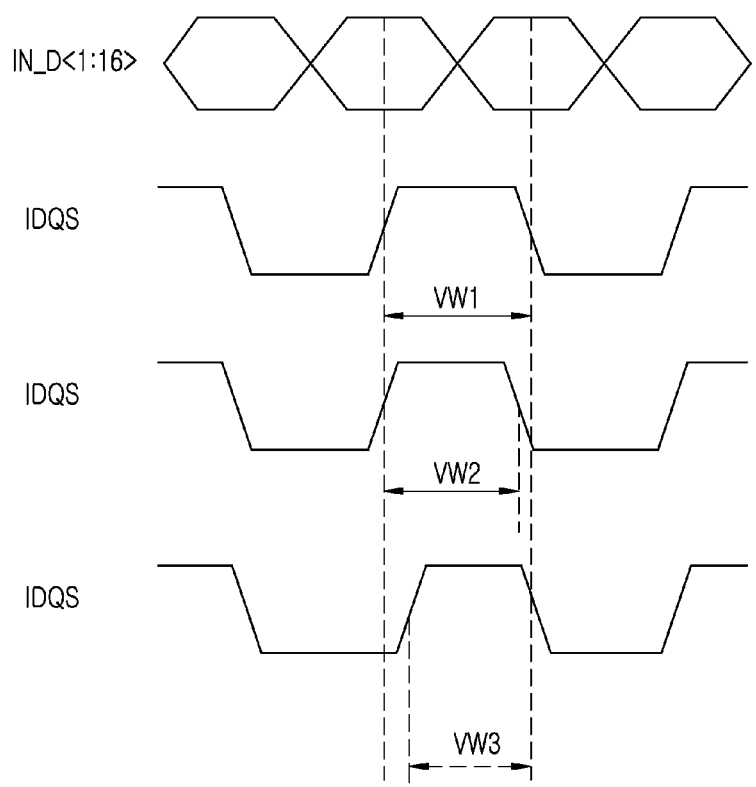

An operation of strobing the first to sixteenth input data IN_D<1:16> in synchronization with a rising interval of the internal strobe signal IDQS is described as follows with reference to FIG. 12.

First, if the duty ratio of the internal strobe signal IDQS is the same, when the first to sixteenth input data IN_D<1:16> are strobed in synchronization with a rising interval of the internal strobe signal IDQS, an interval in which the level of the internal strobe signal IDQS is generated as a logic high level becomes a valid window VW1 of data. That is, if the duty ratio of the internal strobe signal IDQS is the same, the valid window VW1 of data may be optimized.

Next, if the duty ratio of the internal strobe signal IDQS is different and the internal strobe signal IDQS falls fast from a logic high level to a logic low level, when the first to sixteenth input data IN_D<1:16> are strobed in synchronization with a rising interval of the internal strobe signal IDQS, an interval in which the level of the internal strobe signal IDQS is generated as the logic high level is reduced, so that a corresponding valid window of data is reduced (i.e., VW2). That is, if the duty ratio of the internal strobe signal IDQS is different, the valid window of data is reduced.

Next, if the duty ratio of the internal strobe signal IDQS is different and the internal strobe signal IDQS rises slow to a logic high level, when the first to sixteenth input data IN_D<1:16> are strobed in synchronization with a rising interval of the internal strobe signal IDQS, an interval in which the level of the internal strobe signal IDQS is generated as the logic high level is reduced, so that a corresponding valid window of data is reduced (i.e., VW3). That is, if the duty ratio of the internal strobe signal IDQS is different, the valid window of data is reduced.

That is, if the duty ratio of the internal strobe signal IDQS is different, an operation of adjusting the duty ratio of the internal strobe signal IDQS is required because the valid window of data is reduced and thus an error of data occurs.

Such a semiconductor system 1 according to an embodiment of the present disclosure can prevent or mitigate a data error by performing an operation of adjusting the duty ratio of a strobe signal for strobing data within each semiconductor device. The semiconductor system 1 according to an embodiment of the present disclosure can secure a valid window of data by strobing the data in a way to perform an operation of adjusting the duty ratio of a strobe signal for strobing the data within each semiconductor device.

Figure 13:
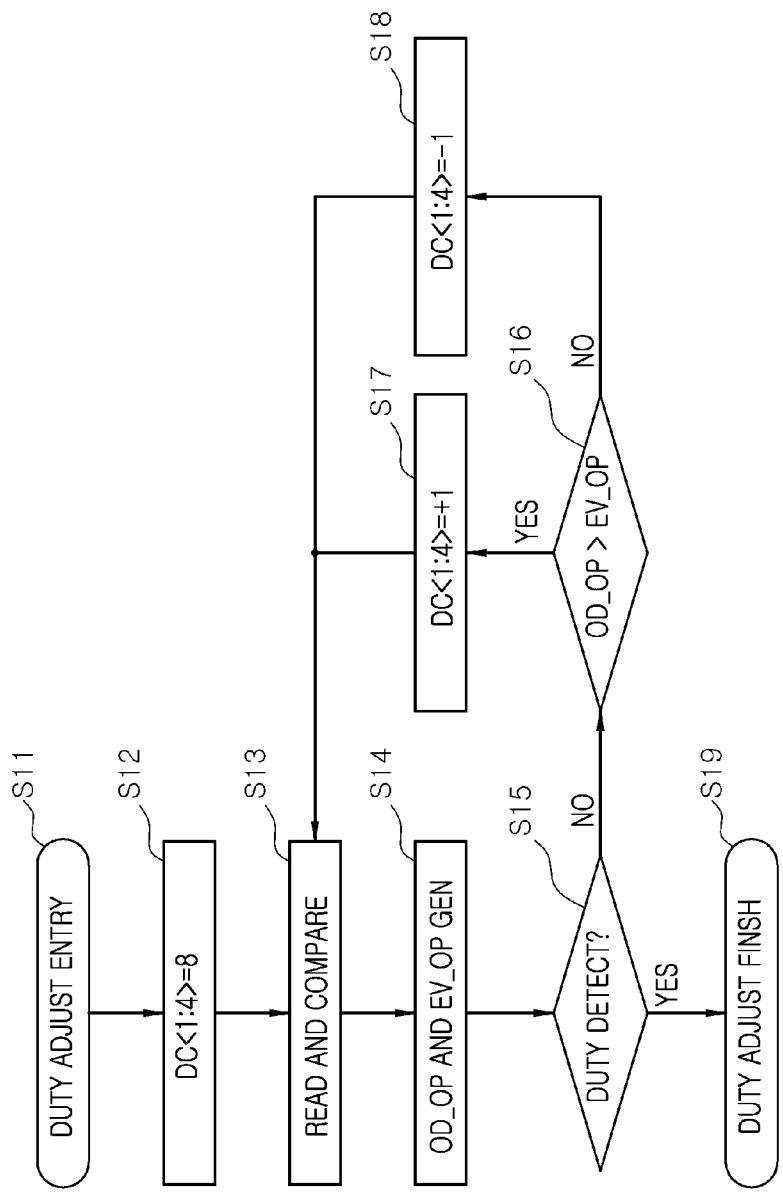
FIG. 13 is a flowchart for describing a duty ratio adjustment operation of the semiconductor system according to an embodiment of the present disclosure.

A duty ratio adjustment operation of the semiconductor system 1 according to an embodiment of the present disclosure is described as follows with reference to FIG. 13.

The duty ratio adjustment operation may include a duty ratio adjustment operation entry step S11, a duty code signal setting step S12, a read and comparison step S13, a comparison information generation step S14, a duty ratio detection step S15, a comparison information comparison step S16, an up-counting step S17, a down-counting step S18, and a duty ratio adjustment operation finish step S19.

The duty ratio adjustment operation entry step S11 may be set as a step of entering an operation of adjusting the duty ratio of the strobe signal DQS.

The duty code signal setting step S12 may be set as a step of setting a logic level combination of the first to fourth duty code signals DC<1:4> to 8, that is, an initial value. The initial value 8 of the first to fourth duty code signals DC<1:4> may be set as "0111". The initial value "0111" of the first to fourth duty code signals DC<1:4> may mean a case in which the level of the first duty code signal DC<1> is a logic high level "1", the level of the second duty code signal DC<2> is a logic high level "1", the level of the third duty code signal DC<3> is a logic high level "1", and the level of the fourth duty code signal DC<4> is a logic low level "0".

The read and comparison step S13 may be set as an operation of outputting, by the second semiconductor device 20, the first to sixteenth output data DOUT<1:16> and the strobe signal DQS and comparing, by the first semiconductor device 10, the first to eighth odd data OD_D<1:8> and the first to eighth even data EV_D<1:8> that are generated from the first to sixteenth output data DOUT<1:16>, and the first to sixteenth pattern data PD<1:16>.

The comparison information generation step S14 may be set as a step of generating the first to M-th odd comparison information signals OD_OP<1:M> from the odd comparison signal ODCS that is generated by comparing the first to eighth odd data OD_D<1:8> and the first to sixteenth pattern data PD<1:16> and generating the first to M-th even comparison information signals EV_OP<1:M> from the even comparison signal EVCS that is generated by comparing the first to eighth even data EV_D<1:8> and the first to sixteenth pattern data PD<1:16>.

The duty ratio detection step S15 may be set as a step of detecting a difference between the first to M-th odd comparison information signals OD_OP<1:M> and the first to M-th even comparison information signals EV_OP<1:M>. When the first to M-th odd comparison information signals OD_OP<1:M> and the first to M-th even comparison information signals EV_OP<1:M> have a difference (NO) in the duty ratio detection step S15, the duty ratio adjustment operation may enter the comparison information comparison step S16. When the first to M-th odd comparison information signals OD_OP<1:M> and the first to M-th even comparison information signals EV_OP<1:M> do not have a difference (YES) in the duty ratio detection step S15, the duty ratio adjustment operation may enter the duty ratio adjustment operation finish step S19.

The comparison information comparison step S16 may be set as a step of entering the up-counting step S17 or the down-counting step S18 based on a result of the comparison between the first to M-th odd comparison information signals OD_OP<1:M> and the first to M-th even comparison information signals EV_OP<1:M>.

The up-counting step S17 may be set as a step of up-counting the first to fourth duty code signals DC<1:4> when the size of an absolute value of the first to M-th odd comparison information signals OD_OP<1:M> is smaller than the size of an absolute value of the first to M-th even comparison information signals EV_OP<1:M> (YES) in the comparison information comparison step S16. In the up-counting step S17, the first to fourth duty code signals DC<1:4> may be up-counted from the initial value "0111", and thus the first to fourth duty code signals DC<1:4> may be generated as "1000". The first to fourth duty code signals DC<1:4> "1000" may mean a case in which the level of the first duty code signal DC<1> is a logic low level "0", the level of the second duty code signal DC<2> is a logic low level "0", the level of the third duty code signal DC<3> is a logic low level "0", and the level of the fourth duty code signal DC<4> is a logic high level "1". When the up-counting step S17 is terminated, the duty ratio adjustment operation may enter the read and comparison step S13 again.

The down-counting step S18 may be set as a step of down-counting the first to fourth duty code signals DC<1:4> when the size of an absolute value of the first to M-th odd comparison information signals OD_OP<1:M> is greater than the size of an absolute value of the first to M-th even comparison information signals EV_OP<1:M> (NO) in the comparison information comparison step S16. In the down-counting step S18, the first to fourth duty code signals DC<1:4> may be down-counted from the initial value "0111", and thus the first to fourth duty code signals DC<1:4> may be generated as "0110". The first to fourth duty code signals DC<1:4> "0110" may mean a case in which the level of the first duty code signal DC<1> is a logic low level "0", the level of the second duty code signal DC<2> is a logic high level "1", the level of the third duty code signal DC<3> is a logic high level "1", and the level of the fourth duty code signal DC<4> is a logic low level "0". When the down-counting step S18 is terminated, the duty ratio adjustment operation may enter the read and comparison step S13 again.

The duty ratio adjustment operation finish step S19 may be set as an operation of fixing the first to fourth duty code signals DC<1:4> when the first to M-th odd comparison information signals OD_OP<1:M> and the first to M-th even comparison information signals EV_OP<1:M> have the same logic level combination (YES).

Such a semiconductor system 1 according to an embodiment of the present disclosure can prevent or mitigate a data error by performing an operation of adjusting the duty ratio of a strobe signal for strobing data within each semiconductor device. The semiconductor system 1 according to an embodiment of the present disclosure can secure a valid window of data by strobing the data in a way to perform an operation of adjusting the duty ratio of a strobe signal for strobing data within each semiconductor device.

Figure 14:
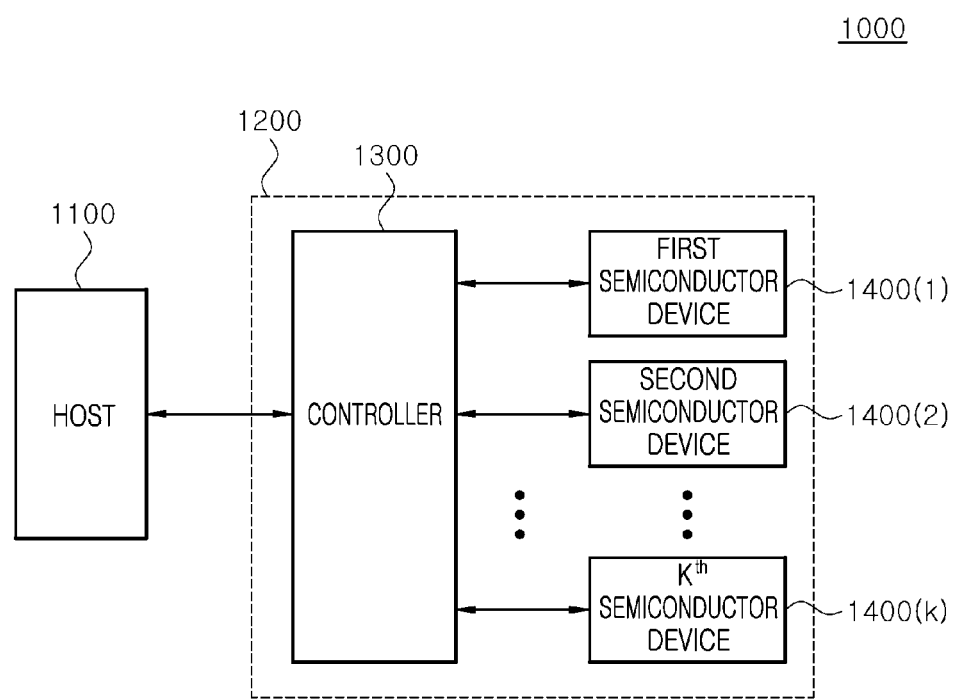
FIG. 14 is a diagram illustrating a construction according to an embodiment of an electronic system to which the semiconductor system for performing a duty ratio adjustment operation, which is illustrated in FIGS. 1 to 13, has been applied.

FIG. 14 is a block diagram illustrating a construction according to an embodiment of an electronic system 1000 according to an embodiment of the present disclosure. As illustrated in FIG. 14, the electronic system 1000 may include a host 1100 and a semiconductor system 1200.

The host 1100 and the semiconductor system 1200 may transmit mutual signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB), etc.

The semiconductor system 1200 may include a controller 1300 and semiconductor devices 1400(K:1). The controller 1300 can prevent a data error by receiving data and a strobe signal from the semiconductor devices 1400(K:1) and performing an operation of adjusting the duty ratio of the strobe signal for strobing data within each semiconductor device. The controller 1300 can secure a valid window of data by strobing the data in a way to perform an operation of adjusting the duty ratio of a strobe signal for strobing data within each semiconductor device. In an embodiment, each of the semiconductor devices 1400(K:1) can prevent or mitigate a data error by receiving data and a clock from the controller 1300 and performing an operation of adjusting the duty ratio of the clock for strobing the data within each semiconductor device. Each of the semiconductor devices 1400(K:1) can, in an embodiment, secure a valid window of data by strobing the data in a way to perform an operation of adjusting the duty ratio of a strobe signal for strobing the data within each semiconductor device.

The controller 1300 may be implemented as the first semiconductor device 10 illustrated in FIG. 1. Each of the semiconductor devices 1400(K:1) may be implemented as the second semiconductor device 20 illustrated in FIG. 1. In some embodiments, the semiconductor device 20 may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor device comprising:
    a data comparison circuit configured to generate an odd comparison signal by comparing odd data that is generated from input data and bits that are included in pattern data, in synchronization with an internal strobe signal, and configured to generate an even comparison signal by comparing even data that is generated from the input data and bits that are included in the pattern data, in synchronization with the internal strobe signal; and
    a strobe signal duty adjustment circuit configured to adjust a duty ratio of the internal strobe signal for latching the input data based on the odd comparison signal and the even comparison signal.

2. The semiconductor device of claim 1, wherein:
    the odd data is generated from bits that are input in synchronization with a rising interval of the internal strobe signal, among bits that are included in the input data, and
    the even data is generated from bits that are input in synchronization with a falling interval of the internal strobe signal, among the bits that are included in the input data.

3. The semiconductor device of claim 1, wherein the pattern data is generated as a preset logic level combination after a start of a read operation.

4. The semiconductor device of claim 1, wherein the data comparison circuit comprises:
    an odd comparison circuit configured to generate the odd comparison signal by comparing the odd data and odd-numbered bits that are included in the pattern data; and
    an even comparison circuit configured to generate the even comparison signal by comparing the even data and even-numbered bits that are included in the pattern data.

5. The semiconductor device of claim 1, wherein the strobe signal duty adjustment circuit is configured to adjust the duty ratio by adjusting a slope of one of a rising interval and falling interval of the internal strobe signal based on the odd comparison signal and the even comparison signal.

6. The semiconductor device of claim 1, wherein the strobe signal duty adjustment circuit is configured to adjust the duty ratio by adjusting a slope of one of a rising interval and falling interval of the internal strobe signal until the odd comparison signal and the even comparison signal become identical with each other.

7. The semiconductor device of claim 1, wherein the strobe signal duty adjustment circuit comprises:
   a code signal generation circuit configured to generate a duty code signal for adjusting a slope of one of a rising interval and falling interval of the internal strobe signal, based on the odd comparison signal and the even comparison signal; and
   an internal strobe signal generation circuit configured to generate the internal strobe signal by adjusting a slope of one of a rising interval and falling interval of an input strobe signal based on the duty code signal.

8. The semiconductor device of claim 7, wherein the code signal generation circuit comprises:
   a comparison information generation circuit configured to generate an odd comparison information signal by consecutively receiving the odd comparison signals and configured to generate an even comparison information signal by consecutively receiving the even comparison signal;
   a calibration control circuit configured to generate a calibration control signal and a calibration fixing signal by comparing a size of an absolute value of the odd comparison information signal and a size of an absolute value of the even comparison information signal; and
   a duty code signal generation circuit configured to generate the duty code signal comprising a logic level combination of which is changed, based on the calibration control signal, and configured to generate the duty code signal comprising a logic level combination of which has been fixed, based on the calibration fixing signal.

9. The semiconductor device of claim 8, wherein the comparison information generation circuit is configured to store the odd comparison information signal and the even comparison information signal when the odd comparison information signal and the even comparison information signal are identical with each other.

10. The semiconductor device of claim 8, wherein the calibration control circuit comprises:
    an information comparison circuit configured to generate a calibration comparison signal and an optimization signal by comparing the size of the absolute value of the odd comparison information signal and the size of the absolute value of the even comparison information signal; and
    a calibration control signal generation circuit configured to generate the calibration control signal based on the calibration comparison signal and configured to generate the calibration fixing signal based on the optimization signal.

11. The semiconductor device of claim 8, wherein the duty code signal generation circuit comprises:
    a control signal generation circuit configured to generate an addition control signal when the calibration control signal is enabled and configured to generate a subtraction control signal when the calibration control signal is disabled; and
    a code control circuit configured to generate the duty code signals that are sequentially up-counted when the addition control signal is enabled and that are sequentially down-counted when the subtraction control signal is disabled and configured to generate the duty code signal comprising a logic level combination of which is fixed when the calibration fixing signal is enabled.

12. The semiconductor device of claim 7, wherein the internal strobe signal generation circuit comprises:
    a first driver configured to drive a first node based on a logic level of the input strobe signal;
    a first transfer strobe signal generation circuit configured to generate a first transfer strobe signal by driving a second node based on a logic level of the first node and configured to have driving power, that drives the second node, adjusted based on a logic level combination of the duty code signal;
    a second transfer strobe signal generation circuit configured to generate a second transfer strobe signal by driving a third node based on a logic level of the second node and configured to have driving power, that drives the third node, adjusted based on a logic level combination of an inverted duty code signal; and
    a second driver configured to generate the internal strobe signal based on a logic level of the second transfer strobe signal.

13. A semiconductor system comprising:
    a first semiconductor device configured to output a clock and pattern data, configured to receive a strobe signal and output data, and configured to adjust a duty ratio of the strobe signal by comparing odd data and even data that are generated from the output data and the pattern data, in synchronization with the strobe signal; and
    a second semiconductor device configured to store the pattern data in synchronization with the clock, configured to output the clock as the strobe signal by adjusting a duty ratio of the clock, and configured to output the stored pattern data as the output data.

14. The semiconductor system of claim 13, wherein:
    the first semiconductor device is implemented as a controller configured to control an operation of the second semiconductor device, and
    the second semiconductor device is implemented as a nonvolatile memory device.

15. The semiconductor system of claim 13, wherein:
    the odd data is generated from bits that are input in synchronization with a rising interval of an internal strobe signal that is generated by adjusting the duty ratio of the strobe signal, among bits that are included in the output data, and
    the even data is generated from bits that are input in synchronization with a falling interval of the internal strobe signal that is generated by adjusting the duty ratio of the strobe signal, among the bits that are included in the output data.

16. The semiconductor system of claim 13, wherein the first semiconductor device is configured to adjust the duty ratio of the strobe signal by comparing the pattern data that is generated as a preset logic level combination after a start of a write operation and the odd data and even data that are generated from the output data after a start of a read operation.

17. The semiconductor system of claim 13, wherein the first semiconductor device comprises:
    a data delay circuit configured to generate input data by delaying the output data after a start of a read operation;
    a strobe signal delay circuit configured to generate an input strobe signal by delaying the strobe signal after the start of the read operation;
    a parallel conversion circuit configured to generate the odd data based on bits that are included in the input data, in synchronization with a rising interval of an internal strobe signal, and configured to generate the even data based on the bits that are included in the input data in synchronization with a falling interval of the internal strobe signal;
a data comparison circuit configured to generate an odd comparison signal and an even comparison signal by comparing the odd data and the pattern data, and the even data and the pattern data, respectively; and
a strobe signal duty adjustment circuit configured to adjust a duty ratio of the internal strobe signal for strobing the input data based on the odd comparison signal and the even comparison signal.

18. The semiconductor system of claim 17, wherein the data comparison circuit comprises:
an odd comparison circuit configured to generate the odd comparison signal by comparing the odd data and odd-numbered bits that are included in the pattern data; and
an even comparison circuit configured to generate the even comparison signal by comparing the even data and even-numbered bits that are included in the pattern data.

19. The semiconductor system of claim 17, wherein the strobe signal duty adjustment circuit is configured to adjust the duty ratio by adjusting a slope of one of the rising interval and falling interval of the internal strobe signal based on the odd comparison signal and the even comparison signal.

20. The semiconductor system of claim 17, wherein the strobe signal duty adjustment circuit comprises:
a code signal generation circuit configured to generate a duty code signal for adjusting a slope of one of the rising interval and falling interval of the internal strobe signal, based on the odd comparison signal and the even comparison signal; and
an internal strobe signal generation circuit configured to generate the internal strobe signal by adjusting a slope of one of a rising interval and falling interval of the input strobe signal based on the duty code signal.

21. The semiconductor system of claim 20, wherein the code signal generation circuit comprises:
a comparison information generation circuit configured to generate an odd comparison information signal by consecutively receiving the odd comparison signals and configured to generate an even comparison information signal by consecutively receiving the even comparison signal;
a calibration control circuit configured to generate a calibration control signal and the calibration fixing signal by comparing a size of an absolute value of the odd comparison information signal and a size of an absolute value of the even comparison information signal; and
a duty code signal generation circuit configured to generate the duty code signal comprising a logic level combination of which is changed, based on the calibration control signal, and configured to generate the duty code signal comprising a logic level combination of which has been fixed, based on the calibration fixing signal.

22. The semiconductor system of claim 21, wherein the comparison information generation circuit is configured to store the odd comparison information signal and the even comparison information signal when the odd comparison information signal and the even comparison information signal are identical with each other.

23. The semiconductor system of claim 21, wherein the calibration control circuit comprises:
an information comparison circuit configured to generate a calibration comparison signal and an optimization signal by comparing the size of the absolute value of the odd comparison information signal and the size of the absolute value of the even comparison information signal; and
a calibration control signal generation circuit configured to generate the calibration control signal based on the calibration comparison signal and configured to generate the calibration fixing signal based on the optimization signal.

24. The semiconductor system of claim 21, wherein the duty code signal generation circuit comprises:
a control signal generation circuit configured to generate an addition control signal when the calibration control signal is enabled and configured to generate a subtraction control signal when the calibration control signal is disabled; and
a code control circuit configured to generate the duty code signals that are sequentially up-counted when the addition control signal is enabled and that are sequentially down-counted when the subtraction control signal is disabled and configured to generate the duty code signal comprising a logic level combination of which is fixed when the calibration fixing signal is enabled.

25. The semiconductor system of claim 20, wherein the internal strobe signal generation circuit comprises:
a first driver configured to drive a first node based on a logic level of the input strobe signal;
a first transfer strobe signal generation circuit configured to generate a first transfer strobe signal by driving a second node based on a logic level of the first node and configured to have driving power, that drives the second node, adjusted based on a logic level combination of the duty code signal;
a second transfer strobe signal generation circuit configured to generate a second transfer strobe signal by driving a third node based on a logic level of the second node and configured to have driving power, that drives the third node, adjusted based on a logic level combination of an inverted duty code signal; and
a second driver configured to generate the internal strobe signal based on a logic level of the second transfer strobe signal.

26. The semiconductor system of claim 13, wherein the second semiconductor device comprises:
a clock buffer configured to generate an input clock by receiving the clock;
a clock delay circuit configured to generate a delay clock by delaying the input clock;
a clock duty adjustment circuit configured to generate an internal clock by adjusting a duty ratio of the delay clock;
a core circuit configured to store the pattern data after a start of a write operation and configured to output the stored pattern data as internal data after a start of a read operation;
a serial conversion circuit configured to generate serial data based on the internal data in synchronization with the internal clock;
a data driver configured to receive the serial data and configured to output the received serial data as the output data; and a strobe signal driver configured to receive the internal clock and configured to output the received internal clock as the strobe signal.

* * * * *